(12) United States Patent
Boettiger

(10) Patent No.: US 10,784,302 B1
(45) Date of Patent: Sep. 22, 2020

(54) SEMICONDUCTOR DEVICE WITH SINGLE-PHOTON AVALANCHE DIODE PIXELS AND A LIGHT ATTENUATING LAYER

(71) Applicant: SEMICONDUCTOR COMPONENTS INDUSTRIES, LLC, Phoenix, AZ (US)

(72) Inventor: Ulrich Boettiger, Garden City, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/460,833

(22) Filed: Jul. 2, 2019

Related U.S. Application Data

(60) Provisional application No. 62/815,040, filed on Mar. 7, 2019.

(51) Int. Cl.
*H01L 31/107* (2006.01)
*H01L 27/146* (2006.01)
*H01L 31/0216* (2014.01)
*H01L 31/0232* (2014.01)

(52) U.S. Cl.
CPC .. *H01L 27/14643* (2013.01); *H01L 31/02165* (2013.01); *H01L 31/02327* (2013.01); *H01L 31/107* (2013.01)

(58) Field of Classification Search
CPC .................................................. H01L 31/02016
See application file for complete search history.

(56) References Cited

U.S. PATENT DOCUMENTS

| | | | |
|---|---|---|---|
| 2001/0020673 | A1 | 9/2001 | Zappa et al. |
| 2003/0058433 | A1 | 3/2003 | Almogy et al. |
| 2006/0124832 | A1 | 6/2006 | Harmon et al. |
| 2006/0202129 | A1 | 9/2006 | Niclass et al. |
| 2015/0115131 | A1 | 4/2015 | Webster et al. |
| 2015/0200314 | A1 | 7/2015 | Webster |
| 2018/0308881 | A1 | 10/2018 | Hynecek |

FOREIGN PATENT DOCUMENTS

| | | |
|---|---|---|
| CN | 104075802 A | 10/2014 |
| DE | 102015102632 A1 | 8/2016 |

*Primary Examiner* — Cheung Lee
(74) *Attorney, Agent, or Firm* — Treyz Law Group, P.C.; Joseph F. Guihan

(57) ABSTRACT

A semiconductor device may include an array of single-photon avalanche diode pixels. The single-photon avalanche diode (SPAD) pixels may be capable of detecting a single photon. To improve dynamic range, a light attenuating layer may be incorporated into the semiconductor device. The light attenuating layer may selectively attenuate the incident light that passes to select SPAD pixels according to a known ratio. Processing circuitry in the system can determine that, for every photon detected by a SPAD pixel receiving attenuated light, more incident photons were actually received in accordance with the ratio. In this way, high photon fluxes may accurately be detected. SPAD pixels covered by a light attenuating element with low attenuation may be sensitive to low incident light levels. SPAD pixels covered by a light attenuating element with high attenuation may be sensitive to high incident light levels.

20 Claims, 10 Drawing Sheets

SEMICONDUCTOR DEVICE WITH SINGLE-PHOTON AVALANCHE DIODE PIXELS AND A LIGHT ATTENUATING LAYER

CROSS-REFERENCE TO RELATED APPLICATIONS

This application claims the benefit of U.S. Provisional Patent Application No. 62/815,040, filed on Mar. 7, 2019, the entire contents of which is incorporated herein by reference.

BACKGROUND

This relates generally to imaging systems and, more particularly, to imaging systems that include single-photon avalanche diodes (SPADs) for single photon detection.

Modern electronic devices such as cellular telephones, cameras, and computers often use digital image sensors. Image sensors (sometimes referred to as imagers) may be formed from a two-dimensional array of image sensing pixels. Each pixel typically includes a photosensitive element (such as a photodiode) that receives incident photons (light) and converts the photons into electrical signals. Image sensors are sometimes designed to provide images to electronic devices using a Joint Photographic Experts Group (JPEG) format.

Conventional image sensors with back side illuminated pixels may suffer from limited functionality in a variety of ways. For example, some conventional image sensors may not be able to determine the distance from the image sensor to the objects that are being imaged. Conventional image sensors may also have lower than desired image quality and resolution.

To improve sensitivity to incident light, single-photon avalanche diodes (SPADs) may sometimes be used in imaging systems. However, although sensitive to low incident light levels, SPADs may have a lower than desired dynamic range.

It would therefore be desirable to be able to provide improved systems that use single-photon avalanche diodes.

DETAILED DESCRIPTION

Embodiments of the present invention relate to imaging systems that include single-photon avalanche diodes (SPAD).

Some imaging systems include image sensors that sense light by converting impinging photons into electrons or holes that are integrated (collected) in pixel photodiodes within the sensor array. After completion of an integration cycle, collected charge is converted into a voltage, which is supplied to the output terminals of the sensor. In complementary metal-oxide semiconductor (CMOS) image sensors, the charge to voltage conversion is accomplished directly in the pixels themselves and the analog pixel voltage is transferred to the output terminals through various pixel addressing and scanning schemes. The analog pixel voltage can also be later converted on-chip to a digital equivalent and processed in various ways in the digital domain.

In single-photon avalanche diode (SPAD) devices (such as the ones described in connection with FIGS. 1-14), on the other hand, the photon detection principle is different. The light sensing diode is biased slightly above its breakdown point and when an incident photon generates an electron or hole, this carrier initiates an avalanche breakdown with additional carriers being generated. The avalanche multiplication may produce a current signal that can be easily detected by readout circuitry associated with the SPAD. The avalanche process needs to be stopped (quenched) by lowering the diode bias below its breakdown point. Each SPAD may therefore include a passive and/or active quenching circuit for quenching the avalanche.

This concept can be used in two ways. First, the arriving photons may simply be counted (e.g., in low light level applications). Second, the SPAD pixels may be used to measure photon time-of-flight (ToF) from a synchronized light source to a scene object point and back to the sensor, which can be used to obtain a 3-dimensional image of the scene.

Figure 1:
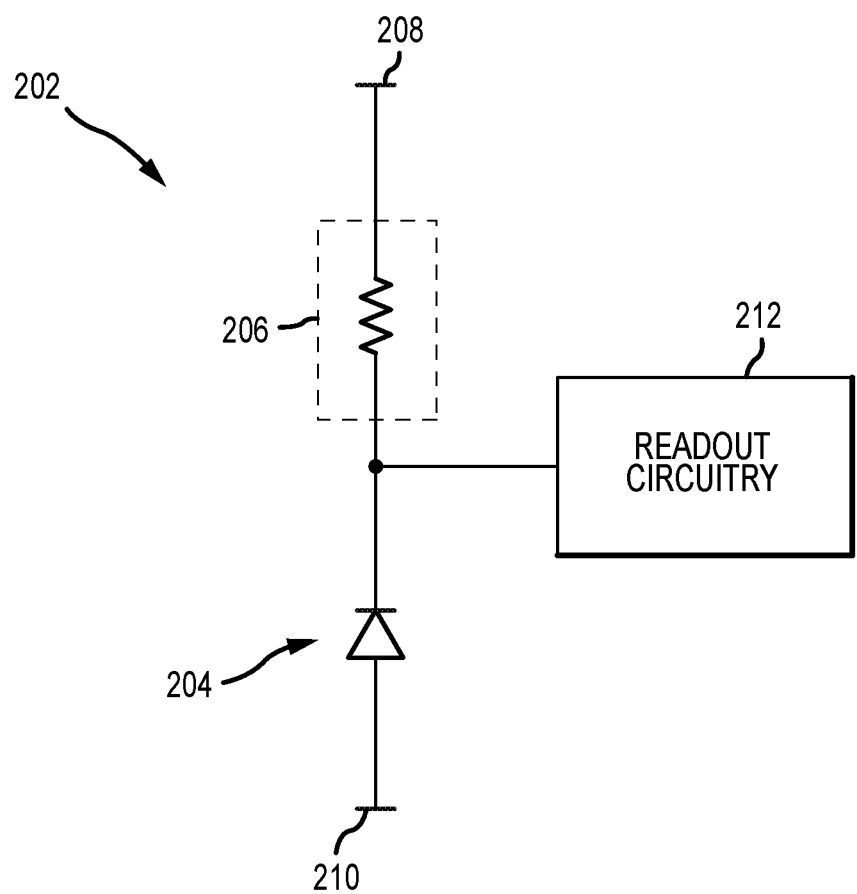
FIG. 1 is a circuit diagram showing an illustrative single-photon avalanche diode pixel in accordance with an embodiment.

FIG. 1 is a circuit diagram of an illustrative SPAD device 202. As shown in FIG. 1, SPAD device 202 includes a SPAD 204 that is coupled in series with quenching circuitry 206 between a first supply voltage terminal 208 (e.g., a ground power supply voltage terminal) and a second supply voltage terminal 210 (e.g., a positive power supply voltage terminal). During operation of SPAD device 202, supply voltage terminals 208 and 210 may be used to bias SPAD 204 to a voltage that is higher than the breakdown voltage. Breakdown voltage is the largest reverse voltage that can be applied without causing an exponential increase in the leakage current in the diode. When SPAD 204 is biased above the breakdown voltage in this manner, absorption of a single-photon can trigger a short-duration but relatively large avalanche current through impact ionization.

Quenching circuitry 206 (sometimes referred to as quenching element 206) may be used to lower the bias voltage of SPAD 204 below the level of the breakdown voltage. Lowering the bias voltage of SPAD 204 below the breakdown voltage stops the avalanche process and corresponding avalanche current. There are numerous ways to form quenching circuitry 206. Quenching circuitry 206 may be passive quenching circuitry or active quenching circuitry. Passive quenching circuitry may, without external control or monitoring, automatically quench the avalanche current once initiated. For example, FIG. 1 shows an example where a resistor is used to form quenching circuitry 206. This is an example of passive quenching circuitry. After the avalanche is initiated, the resulting current rapidly discharges the capacity of the device, lowering the voltage at the SPAD to near to the breakdown voltage. The resistance associated with the resistor in quenching circuitry 206 may result in the final current being lower than required to sustain itself. The SPAD may then be reset to above the breakdown voltage to enable detection of another photon.

This example of passive quenching circuitry is merely illustrative. Active quenching circuitry may also be used in SPAD device 202. Active quenching circuitry may reduce the time it takes for SPAD device 202 to be reset. This may allow SPAD device 202 to detect incident light at a faster rate than when passive quenching circuitry is used, improving the dynamic range of the SPAD device. Active quenching circuitry may modulate the SPAD quench resistance. For example, before a photon is detected, quench resistance is set high and then once a photon is detected and the avalanche is quenched, quench resistance is minimized to reduce recovery time.

SPAD device 202 may also include readout circuitry 212. There are numerous ways to form readout circuitry 212 to obtain information from SPAD device 202. Readout circuitry 212 may include a pulse counting circuit that counts arriving photons. Alternatively or in addition, readout circuitry 212 may include time-of-flight circuitry that is used to measure photon time-of-flight (ToF). The photon time-of-flight information may be used to perform depth sensing.

In one example, photons may be counted by an analog counter to form the light intensity signal as a corresponding pixel voltage. The ToF signal may be obtained by also converting the time of photon flight to a voltage. The example of an analog pulse counting circuit being included in readout circuitry 212 is merely illustrative. If desired, readout circuitry 212 may include digital pulse counting circuits. Readout circuitry 212 may also include amplification circuitry if desired.

The example in FIG. 1 of readout circuitry 212 being coupled to a node between diode 204 and quenching circuitry 206 is merely illustrative. Readout circuitry 212 may be coupled to any desired portion of the SPAD device. In some cases, quenching circuitry 206 may be considered to be integral with readout circuitry 212.

Because SPAD devices can detect a single incident photon, the SPAD devices are effective at imaging scenes with low light levels. Each SPAD may detect how many photons are received within a given period of time (e.g., using readout circuitry that includes a counting circuit). However, as discussed above, each time a photon is received and an avalanche current initiated, the SPAD device must be quenched and reset before being ready to detect another photon. As incident light levels increase, the reset time becomes limiting to the dynamic range of the SPAD device (e.g., once incident light levels exceed a given level, the SPAD device is triggered immediately upon being reset).

Figure 2:
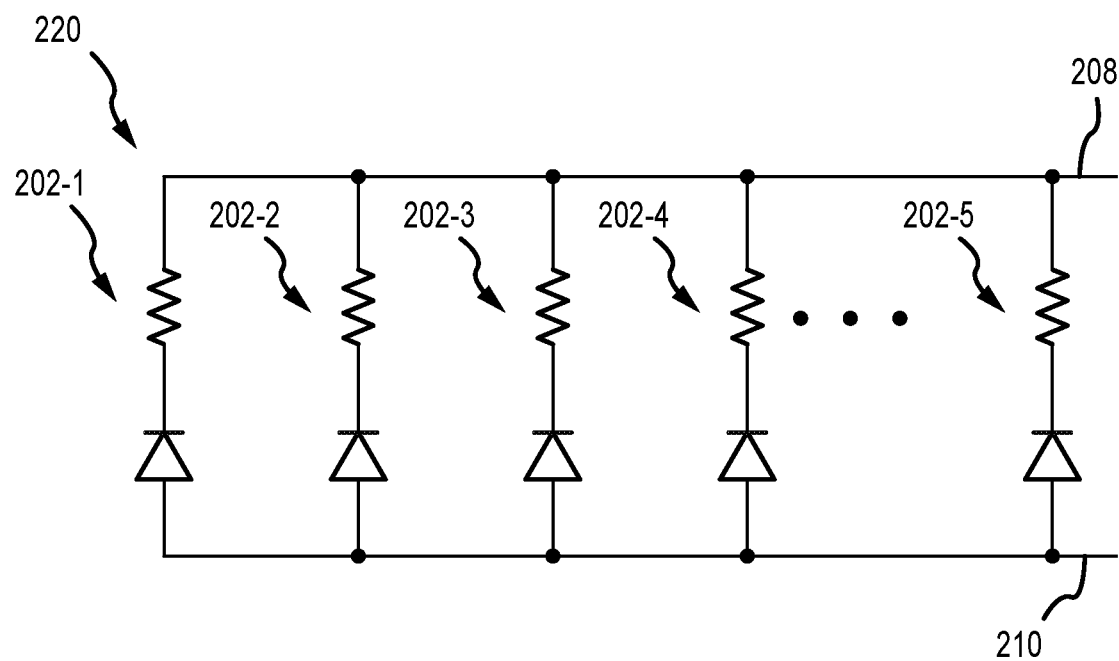
FIG. 2 is a diagram of an illustrative silicon photomultiplier in accordance with an embodiment.

Multiple SPAD devices may be grouped together to increase dynamic range. FIG. 2 is a circuit diagram of an illustrative group 220 of SPAD devices 202. The group of SPAD devices may be referred to as a silicon photomultiplier (SiPM). As shown in FIG. 2, silicon photomultiplier 220 may include multiple SPAD devices that are coupled in parallel between first supply voltage terminal 208 and second supply voltage terminal 210. FIG. 2 shows N SPAD devices 202 coupled in parallel (e.g., SPAD device 202-1, SPAD device 202-2, SPAD device 202-3, SPAD device 202-4, . . . , SPAD device 202-N). More than two SPAD devices, more than ten SPAD devices, more than one hundred SPAD devices, more than one thousand SPAD devices, etc. may be included in a given silicon photomultiplier.

Herein, each SPAD device may be referred to as a SPAD pixel 202. Although not shown explicitly in FIG. 2, readout circuitry for the silicon photomultiplier may measure the combined output current from all of SPAD pixels in the silicon photomultiplier. In this way, the dynamic range of an imaging system including the SPAD pixels may be increased. Each SPAD pixel is not guaranteed to have an avalanche current triggered when an incident photon is received. The SPAD pixels may have an associated probability of an avalanche current being triggered when an incident photon is received. There is a first probability of an electron being created when a photon reaches the diode and then a second probability of the electron triggering an avalanche current. The total probability of a photon triggering an avalanche current may be referred to as the SPAD's photon-detection efficiency (PDE). Grouping multiple SPAD pixels together in the silicon photomultiplier therefore allows for a more accurate measurement of the incoming incident light. For example, if a single SPAD pixel has a PDE of 50% and receives one photon during a time period, there is a 50% chance the photon will not be detected. With the silicon photomultiplier 220 of FIG. 2, chances are that two of the four SPAD pixels will detect the photon, thus improving the provided image data for the time period.

The example of a plurality of SPAD pixels having a common output in a silicon photomultiplier is merely illustrative. In the case of an imaging system including a silicon photomultiplier having a common output for all of the SPAD pixels, the imaging system may not have any resolution in imaging a scene (e.g., the silicon photomultiplier can just detect photon flux at a single point). It may be desirable to use SPAD pixels to obtain image data across an array to allow a higher resolution reproduction of the imaged scene. In cases such as these, SPAD pixels in a single imaging system may have per-pixel readout capabilities. Alternatively, an array of silicon photomultipliers (each including more than one SPAD pixel) may be included in the imaging system. The outputs from each pixel or from each silicon photomultiplier may be used to generate image data for an imaged scene. The array may be capable of independent detection (whether using a single SPAD pixel or a plurality of SPAD pixels in a silicon photomultiplier) in a line array (e.g., an array having a single row and multiple columns or a single column and multiple rows) or an array having more than ten, more than one hundred, or more than one thousand rows and/or columns.

While there are a number of possible use cases for SPAD pixels as discussed above, the underlying technology used to detect incident light is the same. All of the aforementioned examples of devices that use SPAD pixels may collectively be referred to as SPAD-based semiconductor devices. A silicon photomultiplier with a plurality of SPAD pixels having a common output may be referred to as a SPAD-based semiconductor device. An array of SPAD pixels with per-pixel readout capabilities may be referred to as a SPAD-based semiconductor device. An array of silicon photomultipliers with per-silicon-photomultiplier readout capabilities may be referred to as a SPAD-based semiconductor device.

Figure 3:
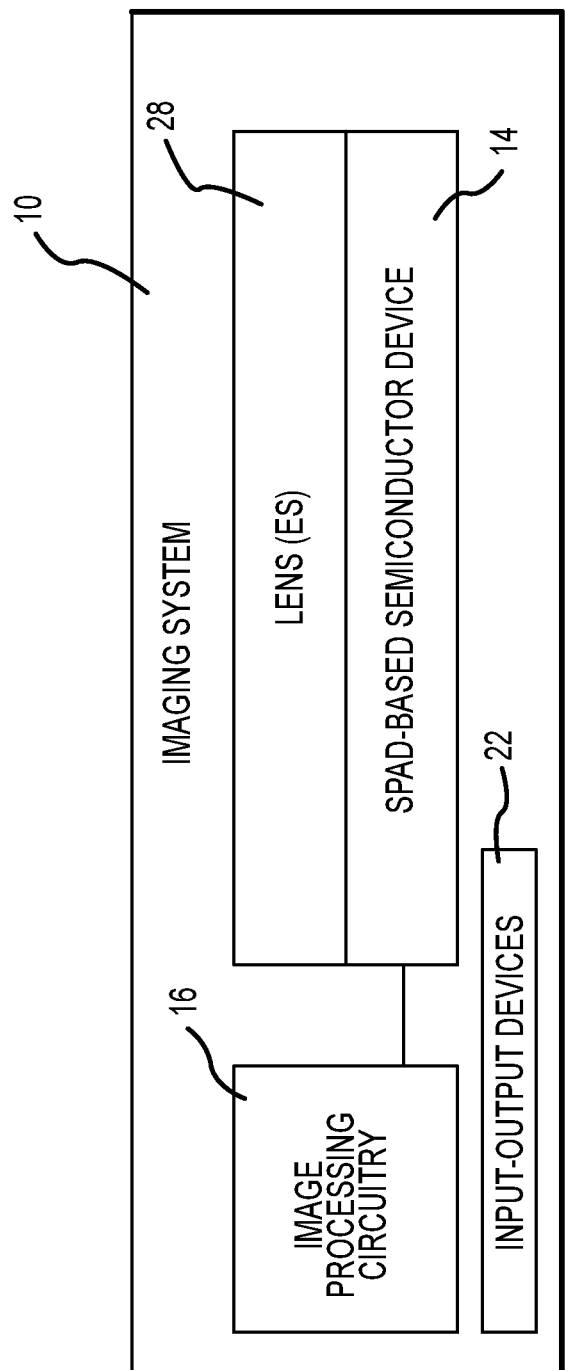
FIG. 3 is a schematic diagram of an illustrative imaging system with a SPAD-based semiconductor device in accordance with an embodiment.

An imaging system 10 with a SPAD-based semiconductor device is shown in FIG. 3. Imaging system 10 may be an electronic device such as a digital camera, a computer, a cellular telephone, a medical device, or other electronic device. Imaging system 10 may be an imaging system on a vehicle (sometimes referred to as vehicular imaging system). Imaging system may be used for LIDAR applications.

Imaging system 14 may include one or more SPAD-based semiconductor devices 14 (sometimes referred to as semiconductor devices 14, devices 14, SPAD-based image sensors 14, or image sensors 14). One or more lenses 28 may optionally cover each semiconductor device 14. During operation, lenses 28 (sometimes referred to as optics 28) may focus light onto SPAD-based semiconductor device 14. SPAD-based semiconductor device 14 may include SPAD pixels that convert the light into digital data. The SPAD-based semiconductor device may have any number of SPAD pixels (e.g., hundreds, thousands, millions, or more).

The SPAD-based semiconductor device 14 may optionally include additional circuitry such as bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Image data from SPAD-based semiconductor device 14 may be provided to image processing circuitry 16. Image processing circuitry 16 may be used to perform image processing functions such as automatic focusing functions, depth sensing, data formatting, adjusting white balance and exposure, implementing video image stabilization, face detection, etc. For example, during automatic focusing operations, image processing circuitry 16 may process data gathered by the SPAD pixels to determine the magnitude and direction of lens movement (e.g., movement of lens 28) needed to bring an object of interest into focus. Image processing circuitry 16 may process data gathered by the SPAD pixels to determine a depth map of the scene.

Imaging system 10 may provide a user with numerous high-level functions. In a computer or advanced cellular telephone, for example, a user may be provided with the ability to run user applications. To implement these functions, the imaging system may include input-output devices 22 such as keypads, buttons, input-output ports, joysticks, and displays. Additional storage and processing circuitry such as volatile and nonvolatile memory (e.g., random-access memory, flash memory, hard drives, solid state drives, etc.), microprocessors, microcontrollers, digital signal processors, application specific integrated circuits, and/or other processing circuits may also be included in the imaging system.

Input-output devices 22 may include output devices that work in combination with the SPAD-based semiconductor device. For example, a light-emitting component may be included in the imaging system to emit light (e.g., infrared light or light of any other desired type). Semiconductor device 14 may measure the reflection of the light off of an object to measure distance to the object in a lidar (light detection and ranging) scheme.

Figure 4:
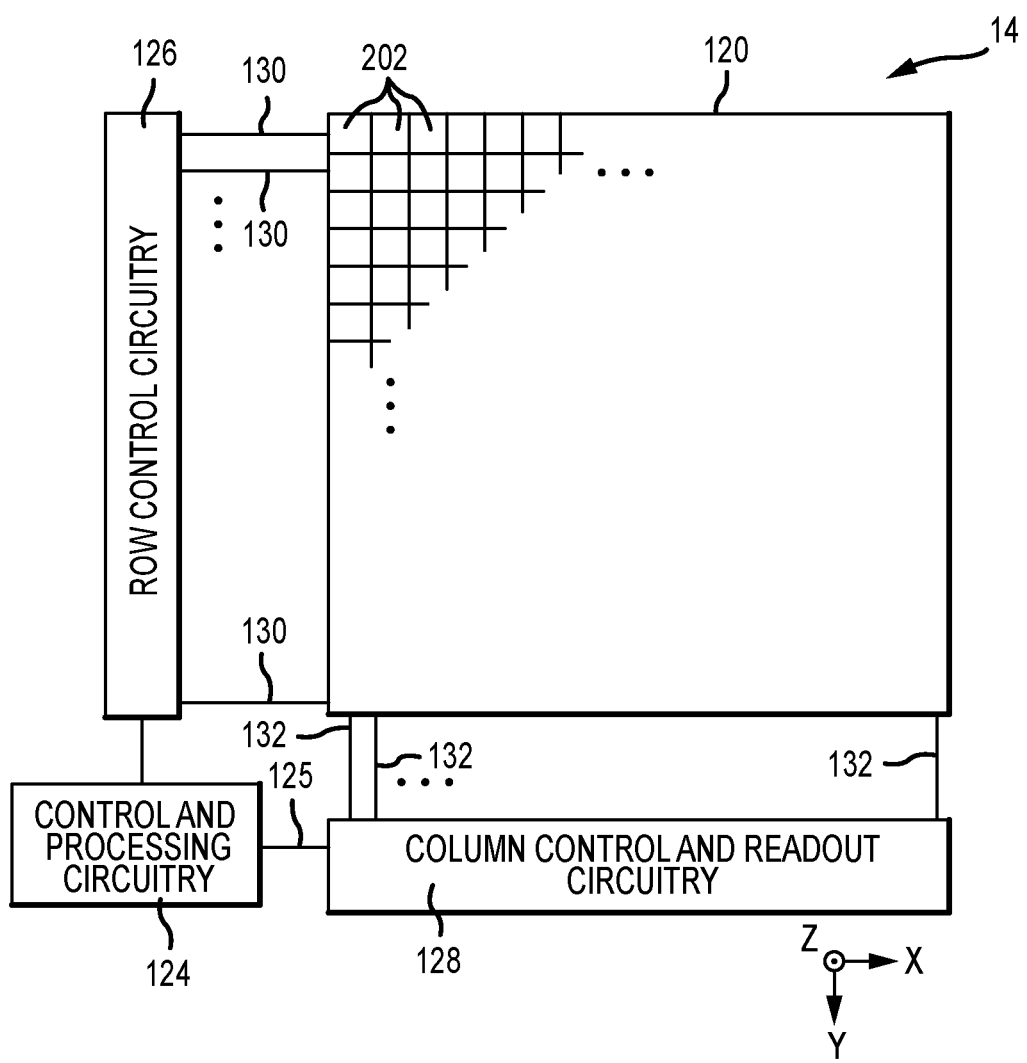
FIG. 4 is a diagram of an illustrative pixel array and associated readout circuitry for reading out image signals in a SPAD-based semiconductor device in accordance with an embodiment.

FIG. 4 shows one example for a semiconductor device 14 that includes an array 120 of SPAD pixels 202 (sometimes referred to herein as image pixels or pixels) arranged in rows and columns. Array 120 may contain, for example, hundreds or thousands of rows and columns of SPAD pixels 202. Each SPAD pixel may be coupled to an analog pulse counter that generates a corresponding pixel voltage based on received photons. Each SPAD pixel may additionally or instead be coupled to a time-of-flight to voltage converter circuit. In both types of readout circuits, voltages may be stored on pixel capacitors and may later be scanned in a row-by-row fashion. Control circuitry 124 may be coupled to row control circuitry 126 and image readout circuitry 128 (sometimes referred to as column control circuitry, readout circuitry, processing circuitry, or column decoder circuitry). Row control circuitry 126 may receive row addresses from control circuitry 124 and supply corresponding row control signals to SPAD pixels 202 over row control paths 130. One or more conductive lines such as column lines 132 may be coupled to each column of pixels 202 in array 120. Column lines 132 may be used for reading out image signals from pixels 202 and for supplying bias signals (e.g., bias currents or bias voltages) to pixels 202. If desired, during pixel readout operations, a pixel row in array 120 may be selected using row control circuitry 126 and image signals generated by image pixels 202 in that pixel row can be read out along column lines 132.

Image readout circuitry 128 may receive image signals (e.g., analog or digital signals from the SPAD pixels) over column lines 132. Image readout circuitry 128 may include sample-and-hold circuitry for sampling and temporarily storing image signals read out from array 120, amplifier circuitry, analog-to-digital conversion (ADC) circuitry, bias circuitry, column memory, latch circuitry for selectively enabling or disabling the column circuitry, or other circuitry that is coupled to one or more columns of pixels in array 120 for operating pixels 202 and for reading out signals from pixels 122. ADC circuitry in readout circuitry 128 may convert analog pixel values received from array 120 into corresponding digital pixel values (sometimes referred to as digital image data or digital pixel data). Alternatively, ADC circuitry may be incorporated into each SPAD pixel 202. Image readout circuitry 128 may supply digital pixel data to control and processing circuitry 124 and/or image processing and data formatting circuitry 16 (FIG. 1) over path 125 for pixels in one or more pixel columns.

The example of image sensor 14 having readout circuitry to read out signals from the SPAD pixels in a row-by-row manner is merely illustrative. In other embodiments, the readout circuitry in the image sensor may simply include digital pulse counting circuits coupled to each SPAD pixel. Any other desired readout circuitry arrangement may be used.

If desired, array 120 may be part of a stacked-die arrangement in which pixels 202 of array 120 are split between two or more stacked substrates. Alternatively, pixels 202 may be formed in a first substrate and some or all of the corresponding control and readout circuitry may be formed in a second substrate. Each of the pixels 202 in the array 120 may be split between the two dies at any desired node within pixel.

It should be understood that instead of having an array of SPAD pixels as in FIG. 4, SPAD-based semiconductor device 14 may instead have an array of silicon photomultipliers (each of which includes multiple SPAD pixels with a common output).

Adding SPAD pixels to a semiconductor device is one way to increase dynamic range of a SPAD semiconductor device. However, the additional SPADs take up additional space on the semiconductor device. Dynamic range increases are therefore limited by the physical space available on the semiconductor device.

To further improve dynamic range, a light attenuating layer may be incorporated into the semiconductor device. The light attenuating layer may selectively attenuate the incident light that passes to select SPAD pixels according to a known ratio. For example, a SPAD pixel may be covered by a portion of the light attenuating layer that transmits only 10% of incident light. In this case, the portion of the light attenuating layer may be considered to have a transmission (sometimes referred to as transmission percentage) of 10%.

The processing circuitry in the semiconductor device can determine that, for every photon detected by that SPAD pixel, ten incident photons were likely received. In this way, high photon fluxes may accurately be detected.

Figure 5:
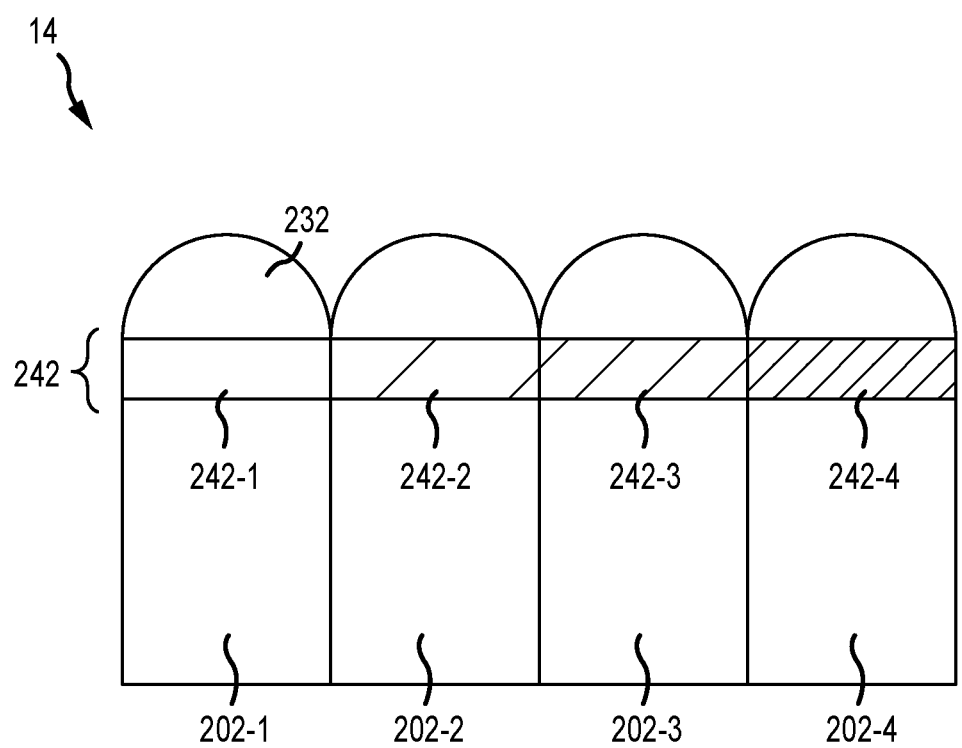
FIG. 5 is a cross-sectional side view of an illustrative SPAD-based semiconductor device that includes a light attenuating layer formed over single-photon avalanche diode pixels in accordance with an embodiment.

FIG. 5 is a cross-sectional side view of an illustrative SPAD-based semiconductor device 14 with a light attenuating layer. As shown in FIG. 5, SPAD-based semiconductor device 14 includes a plurality of SPAD pixels 202. Each SPAD pixel may be covered by a respective microlens 232. In other arrangements, microlenses 232 may be omitted from the SPAD-based semiconductor device.

Light attenuating layer 242 is formed over the SPAD pixels. Light attenuating layer 242 may have a plurality of portions, with each portion transmitting a different amount of incident light. Portion 242-1 of light attenuating layer 242 is formed over SPAD pixel 202-1. Portion 242-2 of light attenuating layer 242 is formed over SPAD pixel 202-2. Portion 242-3 of light attenuating layer 242 is formed over SPAD pixel 202-3. Portion 242-4 of light attenuating layer 242 is formed over SPAD pixel 202-4. Each portion of light attenuating layer 242 may have a different associated transmission.

For example, portion 242-1 of the light attenuating layer may transmit all incident light (e.g., more than 95% of incident light, more than 99% of incident light, etc.). Portion 242-2 of the light attenuating layer may transmit half of incident light (e.g., between 40% and 60% of incident light). Portion 242-3 of the light attenuating layer may transmit a quarter of incident light (e.g., between 20% and 30% of incident light). Portion 242-4 of the light attenuating layer may transmit an eighth of incident light (e.g., between 10% and 15% of incident light). In this way, the transmission of incident light varies across the SPAD-based semiconductor device. This may increase the dynamic range of the SPAD-based semiconductor device. SPAD pixels with low attenuation (e.g., SPAD pixel 202-1) may be sensitive to low incident light levels. SPAD pixels with high attenuation (e.g., SPAD pixel 202-4) may be sensitive to high incident light levels. The SPAD-based semiconductor device as a whole therefore has an increased dynamic range due to presence of the light attenuating layer.

Figure 6:
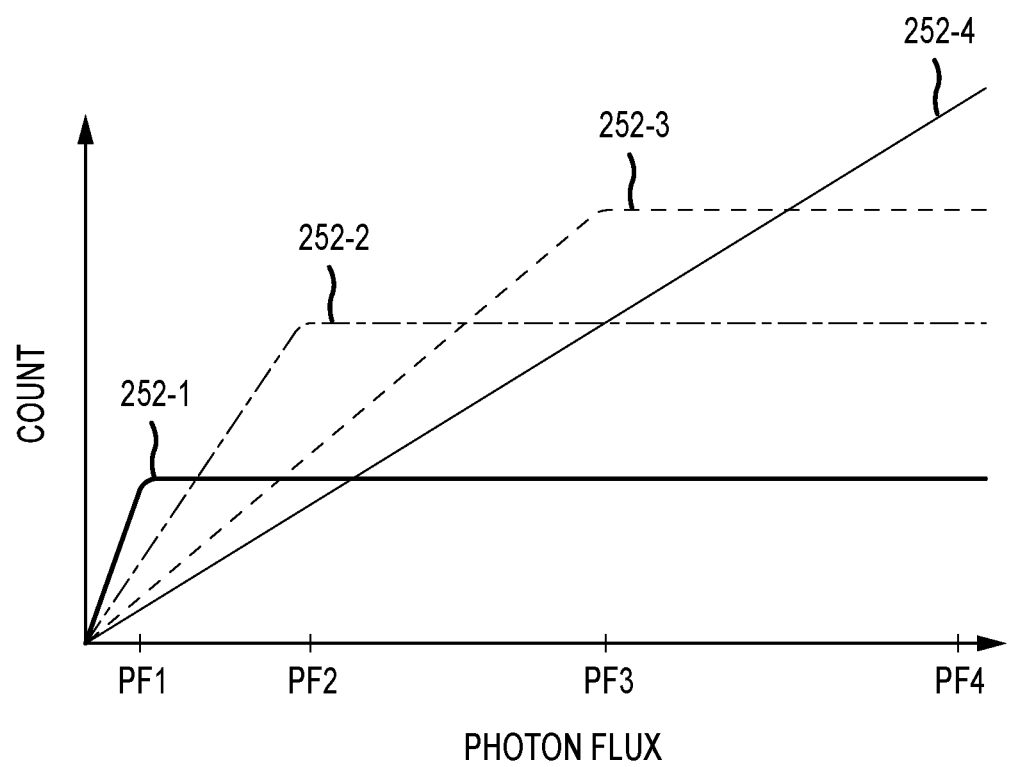
FIG. 6 is a graph showing photon count as a function of photon flux for the single-photon avalanche diode pixels of FIG. 5 in accordance with an embodiment.

FIG. 6 is a graph illustrating how the dynamic range of the SPAD-based semiconductor device is increased by the light attenuating layer of FIG. 5. Line 252-1 shows count (e.g., number of photons detected by a digital counting circuit) as a function of photon flux of SPAD pixel 202-1 of FIG. 5. Line 252-2 shows the response of SPAD pixel 202-2 of FIG. 5. Line 252-3 shows the response of SPAD pixel 202-3 of FIG. 5. Line 252-4 shows the response of SPAD pixel 202-4 of FIG. 5.

The portion of the light attenuator layer above SPAD pixel 202-1 may not attenuate light (e.g., all incident light may be transmitted through the portion of the light attenuator layer above SPAD pixel 202-1). Therefore, as shown in FIG. 6, SPAD pixel 202-1 is sensitive to low photon flux levels. Between a photon flux of 0 and PF1, the count from SPAD pixel 202-1 increases with increasing photon flux. The slope of line 252-1 is relatively high between a photon flux of 0 and PF1, meaning the SPAD pixel is sensitive to these low photon flux levels. However, above PF1 the SPAD pixel may saturate. This means that as photon flux increases beyond PF1, the count from the SPAD pixel remains relatively constant (as shown by line 252-1).

The portion of the light attenuator layer above SPAD pixel 202-2 may attenuate more light than the portion of the light attenuator layer above SPAD pixel 202-1. Therefore, as shown in FIG. 6, SPAD pixel 202-1 is less sensitive to low photon flux levels, as shown by the lower slope of line 252-2 between 0 and PF2. However, SPAD pixel 202-2 does not saturate until a photon flux level of PF2 (which is higher than the saturation point PF1 of pixel 202-1). Light attenuator portion 242-3 attenuates even more light than light attenuator portion 242-2. The slope of line 252-3 is therefore decreased compared to line 252-2. The saturation level of line 252-3 (PF3) is also higher than the saturation point of line 252-2. Light attenuator portion 242-4 attenuates even more light than light attenuator portion 242-3. The slope of line 252-4 is therefore decreased compared to line 252-3. The saturation level of line 252-4 is also higher (PF4) than the saturation point of line 252-3.

The presence of the light attenuator level in FIG. 5 therefore enables detection of photon fluxes at high levels while preserving sensitivity to photon fluxes at low levels. Processing circuitry within the imaging system (e.g., image processing circuitry 16 in FIG. 1) may combine the outputs from the different pixels to form a single high dynamic range image.

Light attenuating layer 242 in FIG. 5 may be formed from any desired materials. In one example, the light attenuating layer may be formed from a polymeric filter (sometimes referred to as a gray filter) that is formed from polymer materials. The gray level of each light attenuating layer portion may determine the transmission characteristics of that portion. In another example, the light attenuating layer may be formed from an opaque layer with holes. The opaque layer may be formed from metal or a dielectric material. The number and size of the holes in each light attenuating layer portion may determine the transmission characteristics of that portion (e.g., more holes will result in more transmission and larger holes will result in more transmission). In yet another example, interference filters may be used to form the light attenuating layer. Interference filters may be used to provide wavelength specific filtering in the SPAD-based semiconductor device. Each interference filter may block (reflect) some wavelengths of incident light and transmit (at any desired percentage) other wavelengths of incident light. The transmission percentage of each wavelength may be varied between different portions of the light attenuating layer.

Each light attenuating layer portion may sometimes be referred to as a filter element, filter, polymeric filter, opaque filter, interference filter, light attenuating element, etc.

Each light attenuating layer portion may have any desired transmission characteristics. Each light attenuating layer may transmit more than 99% of light, more than 95% of light, more than 90% of light, more than 80% of light, more than 60% of light, more than 40% of light, more than 20% of light, more than 10% of light, more than 5% of light, more than 1% of light, less than 99% of light, less than 95% of light, less than 90% of light, less than 80% of light, less than 60% of light, less than 40% of light, less than 20% of light, less than 10% of light, less than 5% of light, less than 1% of light, between 40% and 60% of light, between 70% and 80% of light, between 20% and 40% of light, between 10% and 20% of light, between 5% and 10% of light, between 1% and 5% of light, between 1% and 10% of light, between 1% and 20% of light, between 5% and 60%, etc.

A given light attenuating layer portion may have any desired transmission compared to adjacent light attenuating layer portions. For example, the light attenuating layer portion having the highest transmission in the sensor and the light attenuating layer portion having the lowest transmission in the sensor may have transmission percentages that differ by a factor of more than 2, differ by a factor of more than 4, differ by a factor of more than 8, differ by a factor of more than 16, differ by a factor of more than 32, differ by a factor of more than 64, differ by a factor of more than 100, differ by a factor of more than 1000, differ by a factor between 1.5 and 10, differ by a factor between 5 and 20, differ by a factor between 10 and 100, etc.

Figure 7:
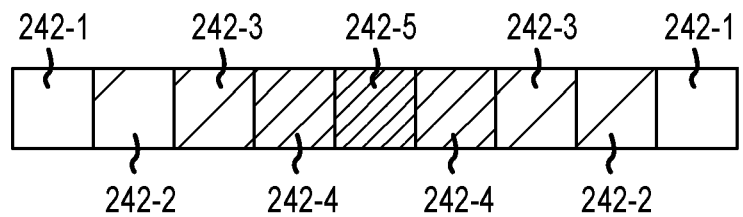
FIGS. 7-14 are top views of illustrative patterns of light attenuating layer portions having varying transmission that may be included in a SPAD-based semiconductor device in accordance with an embodiment.

The light attenuating layer portions of varying transmission percentages may have any desired arrangement across the SPAD-based semiconductor device. In some cases, a pattern of light attenuating layer portions (e.g., a unit cell) may be repeated across the light attenuating layer. FIG. 7 is a top view of an illustrative light attenuating layer pattern showing a group of light attenuating layer portions in a single row. Each light attenuating layer portion covers a respective SPAD pixel. As shown, the light attenuating layer includes light attenuating layer portions 242-1 having a first transmission percentage, light attenuating layer portions 242-2 having a second transmission percentage that is less than the first transmission percentage, light attenuating layer portions 242-3 having a third transmission percentage that is less than the second transmission percentage, light attenuating layer portions 242-4 having a fourth transmission percentage that is less than the third transmission percentage, and a light attenuating layer portion 242-5 having a fifth transmission percentage that is less than the fourth transmission percentage. In the example of FIG. 7, the light attenuating layer portions are arranged in an order such that the transmission percentage gradually changes from the lowest transmission percentage to the highest transmission percentage. This example is merely illustrative.

Figure 8:
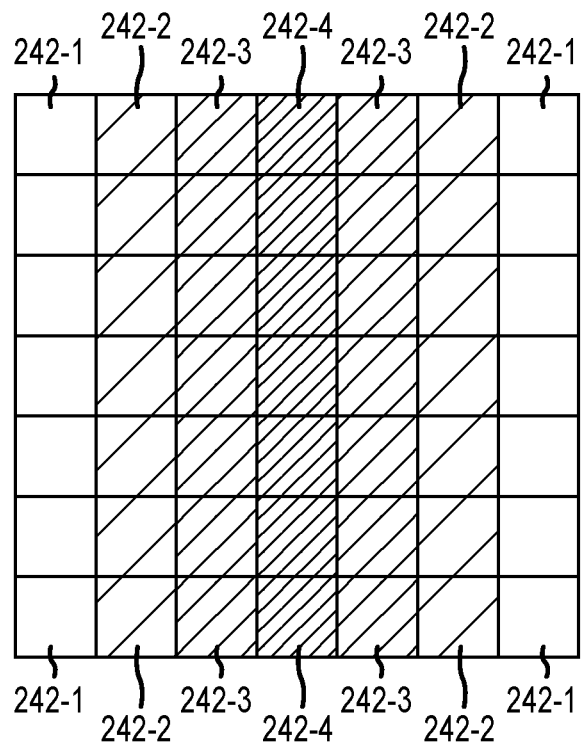

FIG. 8 is a top view of an illustrative light attenuating layer pattern showing a group of light attenuating layer portions in a square. Specifically, FIG. 8 shows a 7×7 pattern that may be repeated across the light attenuating layer. Each light attenuating layer portion covers a respective SPAD pixel. As shown, the light attenuating layer includes light attenuating layer portions 242-1 having a first transmission percentage, light attenuating layer portions 242-2 having a second transmission percentage that is less than the first transmission percentage, light attenuating layer portions 242-3 having a third transmission percentage that is less than the second transmission percentage, and light attenuating layer portions 242-4 having a fourth transmission percentage that is less than the third transmission percentage. In the example of FIG. 8, the light attenuating layer portions are arranged with the same transmission percentage in each column. The transmission percentage of the columns gradually changes from the lowest transmission percentage to the highest transmission percentage. This example is merely illustrative.

Figure 9:
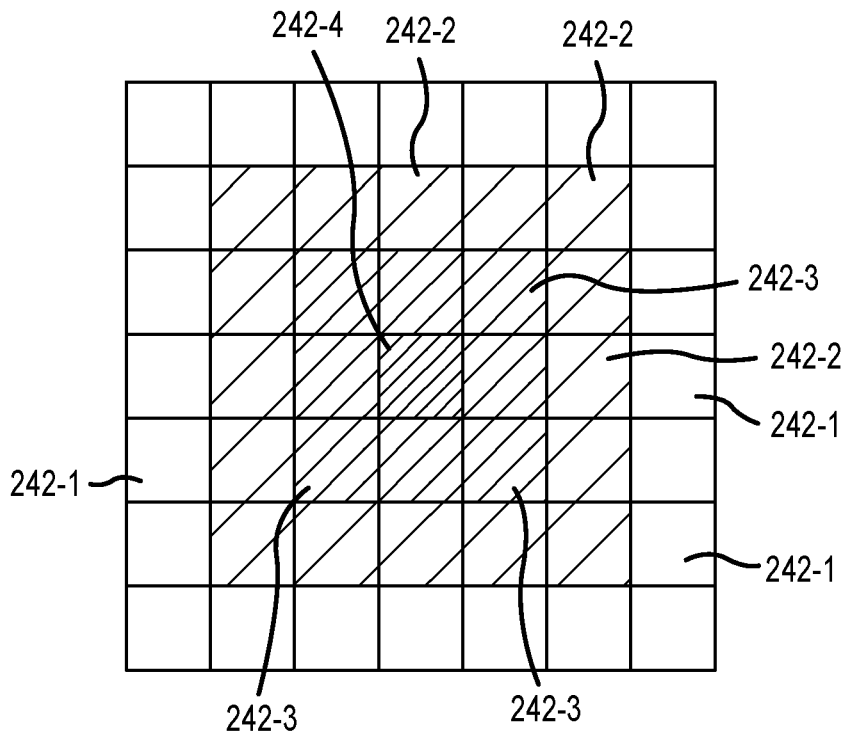

FIG. 9 is a top view of an illustrative light attenuating layer pattern showing a group of light attenuating layer portions arranged in concentric rings. Specifically, FIG. 9 shows a 7×7 pattern that may be repeated across the light attenuating layer. Each light attenuating layer portion covers a respective SPAD pixel. As shown, the light attenuating layer includes light attenuating layer portions 242-1 having a first transmission percentage, light attenuating layer portions 242-2 having a second transmission percentage that is less than the first transmission percentage, light attenuating layer portions 242-3 having a third transmission percentage that is less than the second transmission percentage, and light attenuating layer portion 242-4 having a fourth transmission percentage that is less than the third transmission percentage. In the example of FIG. 9, light attenuating portion 242-4 is formed at the center of the repeating unit cell. Light attenuating portions 242-3 are formed in a ring around light attenuating portion 242-4, with light attenuating portion 242-4 formed at the center of the ring. Light attenuating portions 242-2 are formed in a ring around light attenuating portions 242-3, with light attenuating portion 242-4 formed at the center of the ring. Light attenuating portions 242-1 are formed in a ring around light attenuating portions 242-2, with light attenuating portion 242-4 formed at the center of the ring.

Figure 10:
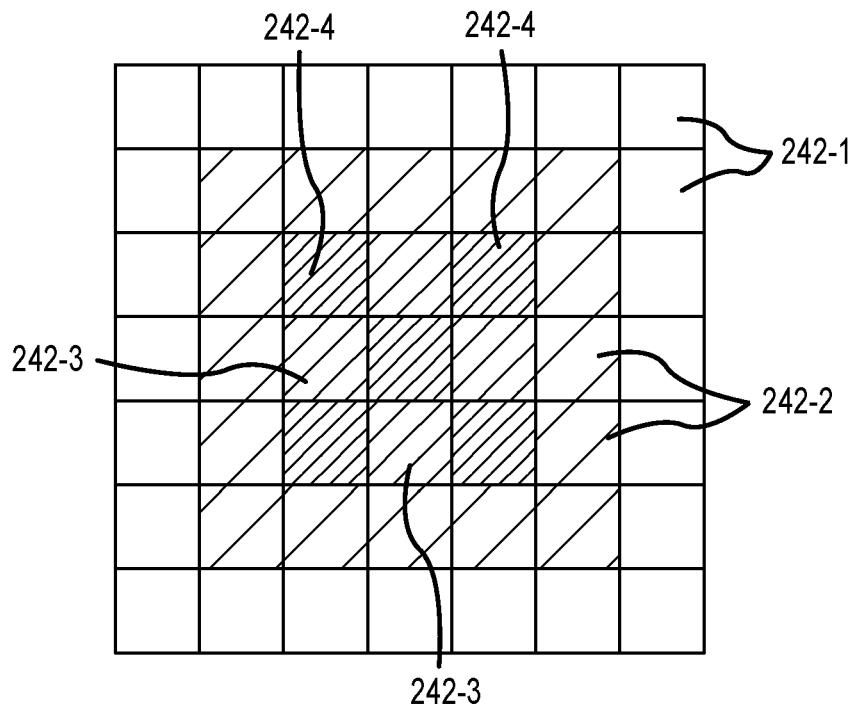

FIG. 10 is a top view of an illustrative light attenuating layer pattern showing a group of light attenuating layer portions arranged in a checkerboard pattern and surrounded by concentric rings. Specifically, FIG. 10 shows a 7×7 pattern that may be repeated across the light attenuating layer. Each light attenuating layer portion covers a respective SPAD pixel. As shown, the light attenuating layer includes light attenuating layer portions 242-1 having a first transmission percentage, light attenuating layer portions 242-2 having a second transmission percentage that is less than the first transmission percentage, light attenuating layer portions 242-3 having a third transmission percentage that is less than the second transmission percentage, and light attenuating layer portions 242-4 having a fourth transmission percentage that is less than the third transmission percentage. In the example of FIG. 10, light attenuating portions 242-3 and 242-4 are arranged in a checkerboard pattern in a 3×3 grid at the center of the repeating unit cell. Light attenuating portions 242-2 are formed in a ring around the checkerboard pattern, with the checkerboard pattern formed at the center of the ring. Light attenuating portions 242-1 are formed in a ring around light attenuating portions 242-2, with the checkerboard pattern formed at the center of the ring.

Figure 11:
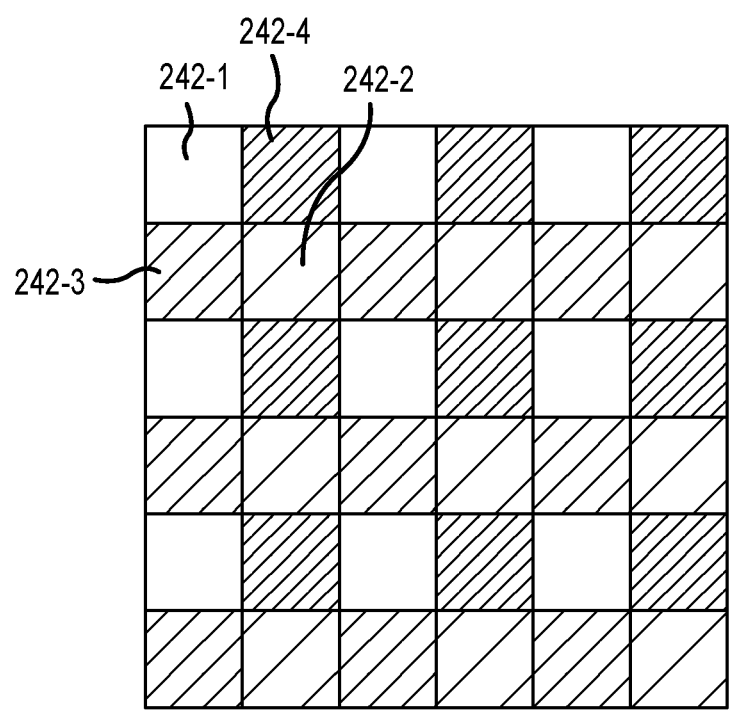

FIG. 11 is a top view of an illustrative light attenuating layer pattern showing a group of light attenuating layer portions arranged in a checkerboard pattern. Specifically, FIG. 11 shows a 2×2 pattern that may be repeated across the light attenuating layer (nine repeating unit cells are shown in FIG. 11 for a total of a 6×6 grid). Each light attenuating layer portion covers a respective SPAD pixel. As shown, the light attenuating layer includes light attenuating layer portions 242-1 having a first transmission percentage, light attenuating layer portions 242-2 having a second transmission percentage that is less than the first transmission percentage, light attenuating layer portions 242-3 having a third transmission percentage that is less than the second transmission percentage, and light attenuating layer portions 242-4 having a fourth transmission percentage that is less than the third transmission percentage. The light attenuating layer portions are arranged in a checkerboard pattern with one of each light attenuating layer portion included in each 2×2 repeating cell.

Figure 12:
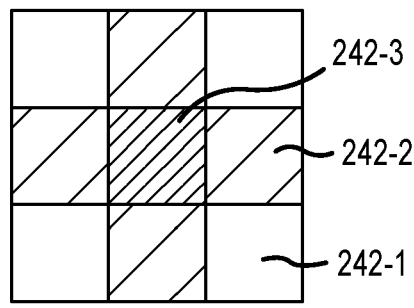

FIG. 12 is a top view of an illustrative light attenuating layer pattern showing a 3×3 group of light attenuating layer portions that may be repeated across the light attenuating layer. Each light attenuating layer portion covers a respective SPAD pixel. As shown, the light attenuating layer includes light attenuating layer portions 242-1 having a first transmission percentage, light attenuating layer portions 242-2 having a second transmission percentage that is less than the first transmission percentage, and a light attenuating layer portion 242-3 having a third transmission percentage that is less than the second transmission percentage. Light attenuating layer portion 242-3 is formed in the center of the 3×3 grid and light attenuating layer portions 242-1 and 242-2 form an alternating ring around the center of the grid.

Figure 13:
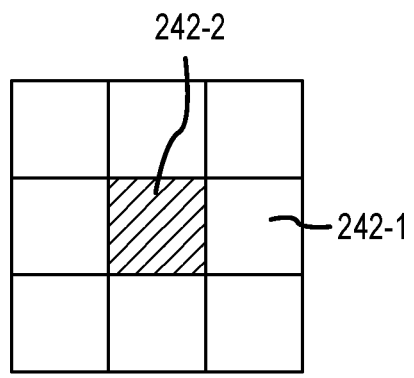

In FIG. 13, only two types of light attenuating layer portions are used in the repeating unit cell. Each light attenuating layer portion covers a respective SPAD pixel. As shown, the light attenuating layer includes light attenuating layer portions 242-1 having a first transmission percentage and a light attenuating layer portion 242-2 having a second transmission percentage that is less than the first transmission percentage. Light attenuating layer portion 242-2 is formed in the center of the 3×3 grid and light attenuating layer portions 242-1 form a ring around the center of the 3×3 grid.

Figure 14:
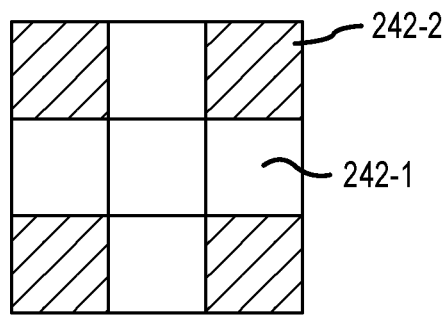

In FIG. 14, another arrangement for a light attenuating layer with two types of light attenuating layer portions is shown. Each light attenuating layer portion covers a respective SPAD pixel. The light attenuating layer includes light attenuating layer portions 242-1 having a first transmission percentage and a light attenuating layer portion 242-2 having a second transmission percentage that is less than the first transmission percentage. As shown, light attenuating layer portions 242-1 may form a plus-sign shape in the 3×3 grid whereas light attenuating layer portions 242-2 may be formed in the corners of the 3×3 grid.

The above examples of illustrative patterns for the light attenuating layer portions are merely illustrative. Each light attenuating layer portion may have any desired transmission percentage and may be arranged in any desired manner.

It should be understood that, in the aforementioned examples of each light attenuating layer portion transmitting any desired percentage of incident light, the transmission percentage may refer to the transmission of any desired wavelength of light. For example, the transmission percentage may apply to all wavelengths of visible light, a specific color of visible light, or another desired type of light (e.g., near-infrared light, ultraviolet light, etc.).

Each repeating unit cell of light attenuating layer portions may have a transmission percentage that varies for a given wavelength (e.g., color) of light and adjacent repeating unit cells may be tailored to different types of light. For example, any of the patterns of light attenuating layer portions in FIGS. 7-14 may be applied to a first group of SPAD pixels and may be designed to have varying transmission of green light. The pattern of light attenuating layer portions may also be applied to a different group of SPAD pixels. Over the different group of SPAD pixels, the light attenuating layer portions may be designed to have varying transmission of blue light. This type of pattern may continue across the array.

In general, the light attenuating layer may be designed for monochrome light attenuation or light attenuation of different types of light in different portions of the array of SPAD pixels. However, regardless of the color-specificity of SPAD-based semiconductor device, the light attenuation layer portions may have varying light attenuation for at least one type of light.

In any of the aforementioned embodiments, it should be understood that a silicon photomultiplier (with multiple SPAD pixels having a common output) may be used in place of a single SPAD pixel. Each silicon multiplier may be covered by a different light attenuator portion having a respective light attenuation (e.g., according to any of the patterns shown in FIGS. 7-14). Using a silicon multiplier in place of each single SPAD pixel may provide additional dynamic range improvements along with the dynamic range improvements from the light attenuating layer.

The foregoing is merely illustrative of the principles of this invention and various modifications can be made by those skilled in the art. The foregoing embodiments may be implemented individually or in any combination.

What is claimed is:

1. A semiconductor device comprising:
   a substrate;
   a first single-photon avalanche diode formed in the substrate;
   a second single-photon avalanche diode formed in the substrate; and
   a light attenuating layer formed over the substrate, wherein a first portion of the light attenuating layer covers the first single-photon avalanche diode and has a first transmission at a given wavelength and wherein a second portion of the light attenuating layer covers the second single-photon avalanche diode and has a second transmission at the given wavelength that is different than the first transmission.

2. The semiconductor device defined in claim 1, further comprising:
   a first microlens formed over the first single-photon avalanche diode, wherein the first portion of the light attenuating layer is interposed between the first microlens and the first single-photon avalanche diode; and
   a second microlens formed over the second single-photon avalanche diode, wherein the second portion of the light attenuating layer is interposed between the second microlens and the second single-photon avalanche diode.

3. The semiconductor device defined in claim 1, wherein the first and second portions of the light attenuating layer comprise a polymer material.

4. The semiconductor device defined in claim 1, wherein the first and second portions of the light attenuating layer are respective first and second interference filters.

5. The semiconductor device defined in claim 1, wherein the light attenuating layer comprises an opaque layer with openings and wherein the first and second portions of the light attenuating layer have different patterns of openings.

6. The semiconductor device defined in claim 1, wherein the light attenuating layer comprises an opaque layer with openings, wherein the second transmission is greater than the first transmission, and wherein the second portion of the light attenuating layer has more openings in the opaque layer than the first portion of the light attenuating layer.

7. The semiconductor device defined in claim 1, wherein the light attenuating layer comprises an opaque layer with openings, wherein the second transmission is greater than the first transmission, and wherein the second portion of the light attenuating layer has larger openings in the opaque layer than the first portion of the light attenuating layer.

8. The semiconductor device defined in claim 1, wherein the first transmission and the second transmission differ by a factor of more than two and less than ten.

9. The semiconductor device defined in claim 1, wherein the first transmission and the second transmission differ by a factor of more than five.

10. The semiconductor device defined in claim 1, wherein the first transmission and the second transmission differ by a factor of more than ten.

11. The semiconductor device defined in claim 1, further comprising:
    a third single-photon avalanche diode formed in the substrate, wherein a third portion of the light attenuating layer covers the third single-photon avalanche diode and has a third transmission at the given wavelength that is different than the first and second transmissions.

12. The semiconductor device defined in claim 1, further comprising:

first quenching circuitry coupled to the first single-photon avalanche diode; and second quenching circuitry coupled to the second single-photon avalanche diode.

13. A semiconductor device comprising:

a plurality of single-photon avalanche diodes;

a plurality of microlenses, wherein each microlens covers a respective one of the plurality of single-photon avalanche diodes; and a plurality of light attenuating elements, wherein each light attenuating element is interposed between a respective microlens and a respective single-photon avalanche diode and wherein the plurality of light attenuating elements includes at least first and second light attenuating elements that have different respective transmission percentages.

14. The semiconductor device defined in claim 13, wherein the transmission percentage of the first light attenuating element is greater than 95% and wherein the transmission percentage of the second light attenuating element is between 5% and 60%.

15. The semiconductor device defined in claim 13, wherein the transmission percentage of the first light attenuating element is greater than 95% and wherein the transmission percentage of the second light attenuating element is between 1% and 20%.

16. The semiconductor device defined in claim 13, further comprising:

processing circuitry configured to combine outputs from the plurality of single-photon avalanche diodes into a single high dynamic range image.

17. A semiconductor device comprising:

an array of single-photon avalanche diodes; and a light attenuating layer formed over the array of single-photon avalanche diodes, wherein the light attenuating layer has a plurality of portions that transmit different amounts of incident light of a given wavelength to the array of single-photon avalanche diodes.

18. The semiconductor device defined in claim 17, wherein the plurality of portions of the light attenuating layer comprises a first subset of portions that transmit a first amount of incident light, a second subset of portions that transmit a second amount of incident light that is greater than the first amount, and a third subset of portions that transmit a third amount of incident light that is greater than the second amount.

19. The semiconductor device defined in claim 18, wherein the first, second, and third subsets of portions of the light attenuating layer are arranged in a repeating pattern across the light attenuating layer.

20. The semiconductor device defined in claim 19, wherein the repeating pattern comprises a unit cell that is repeated across the light attenuating layer and wherein the unit cell comprises concentric rings of the first, second, and third subsets of portions.

\* \* \* \* \*